(12) United States Patent  (10) Patent No.: US 9,368,392 B2
Tseng et al.  (45) Date of Patent: Jun. 14, 2016

(54) MIM CAPACITOR STRUCTURE

(71) Applicant: Taiwan Semiconductor Manufacturing Co., Ltd., Hsin-Chu (TW)

(72) Inventors: Wei-Min Tseng, New Taipei (TW); Shih-Guo Shen, New Taipei (TW); Chien-Chung Wang, New Taipei (TW); Huey-Chi Chu, Hsin-Chu (TW); Wen-Chuan Chiang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/249,498

(22) Filed: Apr. 10, 2014

(65) Prior Publication Data

US 2015/0295020 A1  Oct. 15, 2015

(51) Int. Cl.
  *H01L 21/02* (2006.01)
  *H01L 21/768* (2006.01)
  *H01L 23/48* (2006.01)
  *H01L 27/08* (2006.01)
  *H01L 49/02* (2006.01)

(52) U.S. Cl.
  CPC ........ *H01L 21/76802* (2013.01); *H01L 23/481* (2013.01); *H01L 27/0805* (2013.01); *H01L 28/60* (2013.01)

(58) Field of Classification Search
  None
  See application file for complete search history.

(56) References Cited

U.S. PATENT DOCUMENTS

| | | |
|---|---|---|
| 5,541,428 A | 7/1996 | Nagatomo |
| 5,903,023 A | 5/1999 | Hoshi |
| 5,977,582 A | 11/1999 | Fleming et al. |
| 6,046,467 A | 4/2000 | Arita et al. |
| 6,115,233 A | 9/2000 | Seliskar et al. |
| 6,227,211 B1 | 5/2001 | Yang et al. |
| 6,281,134 B1 | 8/2001 | Yeh et al. |
| 6,720,232 B1 | 4/2004 | Tu et al. |
| 6,919,244 B1 | 7/2005 | Remmel et al. |
| 7,956,400 B2 * | 6/2011 | Smith .............. H01L 28/40 257/306 |
| 8,298,875 B1 | 10/2012 | Or-Bach et al. |
| 8,546,914 B2 * | 10/2013 | Sun .............. H01L 27/0805 257/301 |
| 8,753,953 B1 | 6/2014 | Cheng et al. |
| 2001/0046737 A1 | 11/2001 | Ahn et al. |
| 2002/0094656 A1 | 7/2002 | Armacost et al. |

(Continued)

OTHER PUBLICATIONS

U.S. Appl. No. 14/249,482, filed Apr. 10, 2014.

(Continued)

*Primary Examiner* — Sonya D McCall Shepard
(74) *Attorney, Agent, or Firm* — Eschweiler & Associates, LLC

(57) ABSTRACT

The present disclosure relates to a MIM (metal-insulator-metal) capacitor, and an associated method of formation. In some embodiments, the MIM capacitor includes a first electrode having a capacitor bottom metal layer disposed over a dielectric buffer layer located over an under-metal layer. A capacitor dielectric layer is disposed onto and in direct contact with the capacitor bottom metal layer. A second electrode having a top capacitor metal layer is disposed onto and in direct contact with the capacitor dielectric layer. A capacitor inter-level dielectric (ILD) layer is disposed over the top capacitor metal layer, and a substantially planar etch stop layer disposed over the capacitor ILD layer. The capacitor's simple stack provides for a small step size that prevents topography related issues, while the dielectric buffer layer removes design restrictions on the lower metal layer.

19 Claims, 5 Drawing Sheets

(56) References Cited

U.S. PATENT DOCUMENTS

| | | |
|---|---|---|
| 2003/0049885 A1 | 3/2003 | Iijima et al. |
| 2003/0178665 A1 | 9/2003 | Takenaka |
| 2003/0178666 A1 | 9/2003 | Lee et al. |
| 2003/0232481 A1 | 12/2003 | Huang et al. |
| 2004/0061177 A1 | 4/2004 | Merchant et al. |
| 2004/0140527 A1 | 7/2004 | Furuya et al. |
| 2004/0180530 A1 | 9/2004 | Li et al. |
| 2004/0256654 A1* | 12/2004 | Korner .......... H01L 28/55 257/306 |
| 2005/0062130 A1 | 3/2005 | Ciancio et al. |
| 2005/0170583 A1 | 8/2005 | Park |
| 2005/0205913 A1 | 9/2005 | Yaegashi |
| 2006/0145293 A1 | 7/2006 | Cho |
| 2007/0045702 A1 | 3/2007 | Liang |
| 2007/0200162 A1 | 8/2007 | Tu et al. |
| 2008/0055816 A1 | 3/2008 | Park et al. |
| 2008/0061345 A1 | 3/2008 | Wang |
| 2008/0217775 A1 | 9/2008 | Pai et al. |
| 2008/0277762 A1 | 11/2008 | Takewaki |
| 2008/0290459 A1 | 11/2008 | Barth et al. |
| 2009/0008743 A1 | 1/2009 | Lee et al. |
| 2009/0014835 A1 | 1/2009 | Furumiya et al. |
| 2009/0134493 A1 | 5/2009 | Iwaki |
| 2009/0200638 A1 | 8/2009 | Smith |
| 2010/0065944 A1 | 3/2010 | Tu et al. |
| 2010/0079929 A1 | 4/2010 | Smeys et al. |
| 2010/0127350 A1 | 5/2010 | Totsuka |
| 2010/0164669 A1 | 7/2010 | Soendker et al. |
| 2010/0213572 A1 | 8/2010 | Ching et al. |
| 2010/0270643 A1 | 10/2010 | Iwaki |
| 2010/0289108 A1 | 11/2010 | Meinel et al. |
| 2010/0301451 A1 | 12/2010 | Iwaki |
| 2011/0303284 A1 | 12/2011 | Kim et al. |
| 2012/0091559 A1 | 4/2012 | Tu et al. |
| 2012/0181657 A1 | 7/2012 | Wu et al. |
| 2012/0199946 A1 | 8/2012 | Kageyama |
| 2012/0319239 A1 | 12/2012 | Chang et al. |
| 2013/0020678 A1 | 1/2013 | Tu et al. |
| 2013/0193556 A1 | 8/2013 | Lee et al. |
| 2013/0270675 A1 | 10/2013 | Childs et al. |
| 2013/0277680 A1 | 10/2013 | Green et al. |
| 2013/0285203 A1 | 10/2013 | Hiroi et al. |
| 2013/0292794 A1 | 11/2013 | Pai et al. |
| 2013/0300003 A1 | 11/2013 | Sun et al. |
| 2013/0320493 A1 | 12/2013 | Chang et al. |
| 2014/0159200 A1 | 6/2014 | Loke et al. |
| 2014/0291805 A1 | 10/2014 | Hong |
| 2015/0028408 A1 | 1/2015 | Meiser et al. |
| 2015/0048483 A1 | 2/2015 | Kuo et al. |
| 2015/0061073 A1 | 3/2015 | Kim et al. |
| 2015/0108605 A1 | 4/2015 | Park et al. |
| 2015/0115408 A1 | 4/2015 | Sun et al. |

OTHER PUBLICATIONS

U.S. application No. 114/249,513 filed on Apr. 10, 2014.
Non Final Office Action Dated May 22, 2015 U.S. Appl. No. 14/249,513.
U.S. Appl. No. 14/289,739, filed May 29, 2014.
Non Final Office Action Dated Jul. 14, 2015 U.S. Appl. No. 14/289,739.
Notice of Allowance dated Aug. 14, 2015 for U.S. Appl. No. 14/249,482.
Final Office Action Dated Aug. 28, 2015 U.S. Appl. No. 14/249,513.
Notice of Allowance dated Mar. 14, 2016 U.S. Appl. No. 14/249,513.
Final Office Action Dated Dec. 31, 2015 for U.S. Appl. No. 14/289,739.
Notice of Allowance Dated Apr. 22, 2016 U.S. Appl. No. 14/289,739.

* cited by examiner

# MIM CAPACITOR STRUCTURE

BACKGROUND

Integrated chips are formed on semiconductor die comprising millions or billions of transistor devices. The transistor devices are configured to act as switches and/or to produce power gains so as to enable logical functionality for an integrated chip (e.g., form a processor configured to perform logic functions). Integrated chips often also comprise passive devices, such as capacitors, resistors, inductors, varactors, etc. Passive devices are widely used to control integrated chip characteristics (e.g., gain, time constants, etc.) and to provide an integrated chip with a wide range of different functionalities (e.g., manufacturing analog and digital circuitry on the same die).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
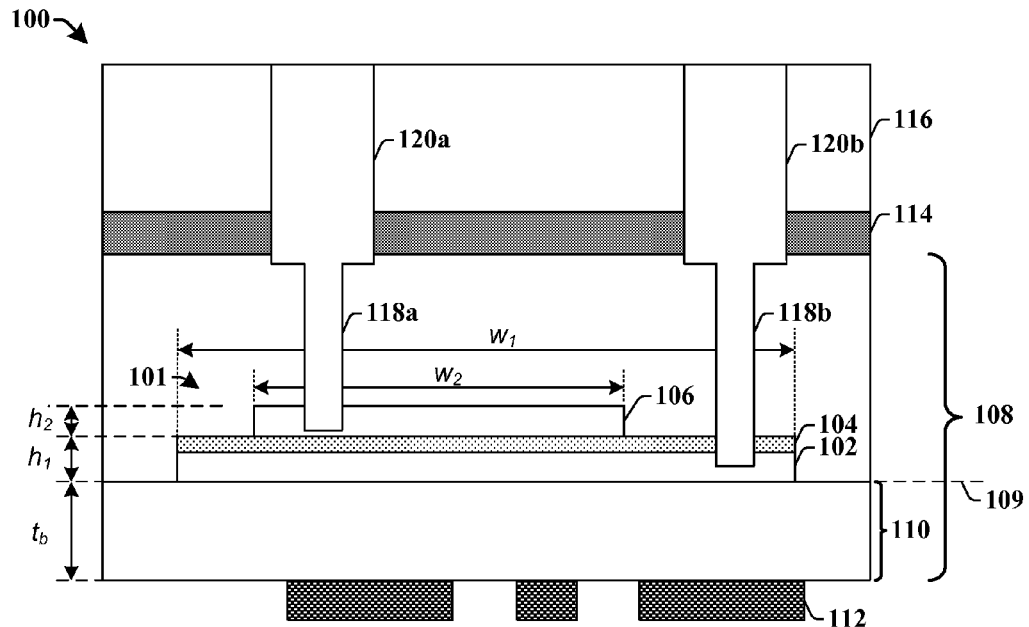
FIG. 1 illustrates a cross-sectional view of some embodiments of an integrated chip having a MIM (metal-insulator-metal) capacitor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MIM (metal-insulator-metal) capacitors are a particular type of capacitor, having a top metal plate and a bottom metal plate separated by a capacitor dielectric, which are often implemented in integrated circuits. MIM capacitors can be used as decoupling capacitors configured to mitigate power supply or switching noise caused by changes in current flowing through various parasitic inductances associated with an integrated chip and a package in which the integrated chip is located. For example, simultaneous switching of the input/output (I/O) and core circuits within an integrated chip can cause a voltage drop on a power supply source by an amount proportional to the inductance of a power bus. This power supply noise may increase signal delay, thereby reducing the operating frequency of a system-on-a-chip (SoC), and inadvertently cause state transitions in logic circuits within the SoC.

MIM capacitors are often integrated into back-end-of-the-line (BEOL) metallization stack, at a position that is vertically disposed between an underlying first metal layer and an overlying second metal layer. However, positioning a MIM capacitor within a BEOL metallization stack can present a number of fabrication problems. For example, MIM capacitors typically have a large number of layers that lead to a topography (e.g., having a step size of more than 400 nm) which is greater than most BOEL metallization layers. Furthermore, metal interconnect layers are not permitted since hillocks, or spike like projections, from such 'under-metal layers' may cause electrical shorting between the under-metal layers and the MIM capacitor.

The present disclosure relates to a MIM (metal-insulator-metal) capacitor, and an associated method of formation. In some embodiments, the MIM capacitor comprises a first electrode comprising a capacitor bottom metal layer disposed over a dielectric buffer layer located over an under-metal layer comprising one or more metal structures located under the bottom capacitor metal layer. A capacitor dielectric layer is disposed onto and in direct contact with the capacitor bottom metal layer. A second electrode comprising a top capacitor metal layer is disposed onto and in direct contact with the capacitor dielectric layer. A capacitor inter-level dielectric (ILD) layer is disposed over the top capacitor metal layer, and a substantially planar etch stop layer is disposed over the capacitor ILD layer. The capacitor's simple stack provides for a small step size that prevents topography related issues, while the dielectric buffer layer removes design restrictions on the lower metal layer.

FIG. 1 illustrates a cross-sectional view of some embodiments of an integrated chip 100 having a MIM (metal-insulator-metal) capacitor 101.

The MIM capacitor 101 includes a bottom electrode comprising a bottom capacitor metal layer 102 and a top electrode comprising a top capacitor metal layer 106. The capacitor bottom and top metal layers, 102 and 106, are electrically isolated from one another by a capacitor dielectric layer 104. The capacitor dielectric layer 104 is configured to separate the bottom capacitor metal layer 102 (i.e., the bottom electrode) from the top capacitor metal layer 106 (i.e., the top electrode), so that the MIM capacitor 101 is able to store energy in an electric field generated between the bottom and top electrodes. The simple structure of the MIM capacitor 101 provides for a relatively small topology that can provide the MIM capacitor with an overall height of less than 2,000 angstroms. For example, MIM capacitor 101 may have first and second steps with heights, $h_1$ and $h_2$, which are between 100 angstroms and 1,000 angstroms, for example.

The MIM capacitor 101 is disposed over a within a capacitor inter-level dielectric (ILD) layer 108 disposed over a semiconductor substrate (not shown). In various embodiments, the capacitor ILD layer 108 may comprise one or more dielectric materials (e.g., low-k dielectric material, oxide material, etc.). In some embodiments, the capacitor ILD layer 108 extends below a bottom surface of the MIM capacitor (line 109) as a dielectric buffer layer 110. In various embodiments, the dielectric buffer layer 110 may have a thickness $t_b$ that is in a range of between approximately 5% and approximately 50% of the thickness of the capacitor ILD layer 108.

An under-metal layer 112 comprising one or more metal structures is disposed under the MIM capacitor 101 at a position below the dielectric buffer layer 110. By separating the bottom capacitor metal layer 102 from the under-metal layer 112 using the dielectric buffer layer 110 is configured to prevent hillocks (i.e., spike or hill-like structures) protruding from under-metal layer 112 from interfering with the MIM capacitor 101. Furthermore, by isolating the MIM capacitor 101 from under-metal layer 112 the dielectric buffer layer 110 also prevents the MIM capacitor 101 from introducing a parasitic capacitance into the under-metal layer 112.

In some embodiments, the MIM capacitor 101 may comprise a stepped pyramid structure having a plurality of steps, in which the different capacitor metal layers (e.g., 102 and 106) form steps that recede in size as a distance from the dielectric buffer layer 110 increases, so as to achieve a shape similar that of a geometric pyramid. For example, the bottom capacitor metal layer 102 may have a first width $w_1$, while the top capacitor metal layer 106 may have a second width $w_2$ that is less than a first width $w_1$. The difference between the first and second widths, $w_1$ and $w_2$, causes the bottom capacitor metal layer 102 to extend beyond the top capacitor metal layer 106 on opposing sides to form the stepped pyramid structure.

A planar etch stop layer 114 is disposed over the capacitor ILD layer 108. A metal ILD layer 116 is disposed over the planar etch stop layer 114. The metal ILD layer 116 surrounds a metal interconnect layer 120 comprising a conductive material (e.g., copper, aluminum, etc.). The planar etch stop layer 114 is configured to act as an etch stop layer used in the formation of a trench of the metal interconnect layer 120. The planar etch stop layer 114 has a planar surface that extends over the MIM capacitor 101. The planar surface is parallel to a top surface of the underlying semiconductor substrate (not shown). In some embodiments, the metal interconnect layer 120 may comprise a metal wire layer configured to provide for lateral connections.

A plurality of vias 118 are configured to connect the metal interconnect layer 120 to the MIM capacitor 101. The plurality of vias 118 are coupled to the metal interconnect layer 120 and provide for vertical connections. For example, a first via 118a, which vertically extends through the planar etch stop layer 114 and the capacitor ILD layer 108, is electrically coupled to the top capacitor metal layer 106. A second via 118b, which vertically extends through the planar etch stop layer 114 and the capacitor ILD layer 108, is electrically coupled to the bottom capacitor metal layer 102.

Figure 2:
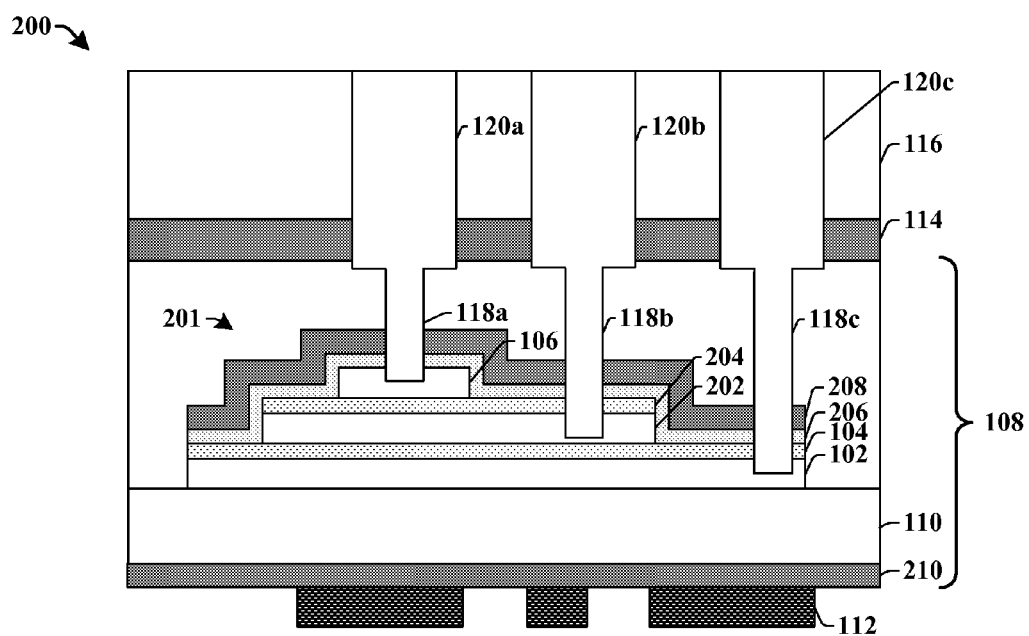
FIG. 2 illustrates a cross-sectional view of some additional embodiments of an integrated chip having a MIM capacitor.

FIG. 2 illustrates a cross-sectional view of some additional embodiments of an integrated chip 200 having a MIM capacitor 201.

The MIM capacitor 201 comprises a bottom capacitor metal layer 102 separated from a middle capacitor metal layer 202 by a first capacitor dielectric layer 104, and a top capacitor metal layer 106 separated from the middle capacitor metal layer 202 by a second capacitor dielectric layer 204. The middle capacitor metal layer 202 has a width that is between that of the bottom capacitor metal layer 102 and the top capacitor metal layer 106, so that the capacitor metal layers, 102, 202, and 106, form steps that recede in size as a distance from a dielectric buffer layer 110 increases. The bottom capacitor metal layer 102, the middle capacitor metal layer 202, and the top capacitor metal layer 106, are disposed within a capacitor inter-level dielectric (ILD) layer 108.

In various embodiments, the bottom capacitor metal layer 102, the middle capacitor metal layer 202, and/or the top capacitor metal layer 106 may comprise various conductive materials, such as indium tin oxide (ITO), aluminum (Al), titanium (Ti), titanium nitride (TiN), tantalum (Ta), tantalum nitride (TaN), tungsten (W), tungsten nitride (WN), molybdenum nitride (MoN), copper (Cu), platinum (Pt), palladium (Pd), osmium (Os), ruthenium (Ru), iridium oxide ($IrO_2$), rhenium oxide ($ReO_2$), rhenium trioxide ($ReO_3$), or a combination thereof. In some embodiments, the bottom capacitor metal layer 102, the middle capacitor metal layer 202, and the top capacitor metal layer 106 may respectively have a thickness in a range of between approximately 100 angstroms and approximately 800 angstroms.

In some embodiments, the first capacitor dielectric layer 104 and/or the second capacitor dielectric layer 204 comprise a high-k dielectric material (i.e., a dielectric material having a dielectric constant greater than silicon dioxide). In various embodiments, the first capacitor dielectric layer 104 and/or the second capacitor dielectric layer 204 may comprise a single layer. In other embodiments, the first capacitor dielectric layer 104 and/or the second capacitor dielectric layer 204 may comprise a complex layer of silicon dioxide ($SiO_2$), silicon nitride ($Si_3N_4$), aluminum oxide ($Al_2O_3$), tantalum oxide ($Ta_2O_5$), titanium oxide ($TiO_2$), strontium titanate ($SrTiO_3$), zirconium oxide ($ZrO_2$), hafnium oxide ($HfO_2$), hafnium silicate ($HfSiO_4$), lanthanum oxide ($La_2O_3$), yttrium oxide ($Y_2O_3$), etc. In some embodiments, the first capacitor dielectric layer 104 and the second capacitor dielectric layer 204 may respectively have a thickness in a range of between approximately 20 angstroms and approximately 200 angstroms.

In some embodiments, the MIM capacitor 201 may further comprise a cap layer 206. The cap layer 206 may comprise a stepped layer that is disposed onto the top capacitor metal layer 106, the first capacitor dielectric layer 104, and the second capacitor dielectric layer 204. The cap layer 206 is configured to prevent interaction between adjacent layers (e.g., to prevent diffusion from the capacitor metal layers to an adjacent dielectric material or to protect underlying layers from further processing). In various embodiments, the cap layer 206 may comprise a conductive cap layer or a dielectric cap layer.

In some embodiments, the MIM capacitor 201 may further comprise a capacitor etch stop layer 208 disposed onto the cap layer 206 at a position that is between the cap layer 206 and the capacitor ILD layer 108. The capacitor etch stop layer 208 comprises a stepped layer that is conformal to the top surface of the cap layer 206. In various embodiments, the capacitor etch stop layer 208 may have a thickness that is in a range of between approximately 100 angstroms and approximately 2,000 angstroms.

One or more vias 118 are configured to extend through a planar etch stop layer 114 and the capacitor ILD layer 108 to positions that provide for electrical connections to the bottom capacitor metal layer 102, the middle capacitor metal layer 202, and the top capacitor metal layer 106. For example, in some embodiments, a first via 118a is configured to provide for a vertical connection between the top capacitor metal layer 106 and a metallization layer disposed within an overlying metal ILD layer 116. A second via 118b is configured to provide for a vertical connection between the middle capacitor metal layer 202 and a metallization layer disposed within the metal ILD layer 116. A third via 118c is configured to provide for a vertical connection between the bottom capacitor metal layer 102 and a metallization layer disposed within the metal ILD layer 116.

Figure 3:
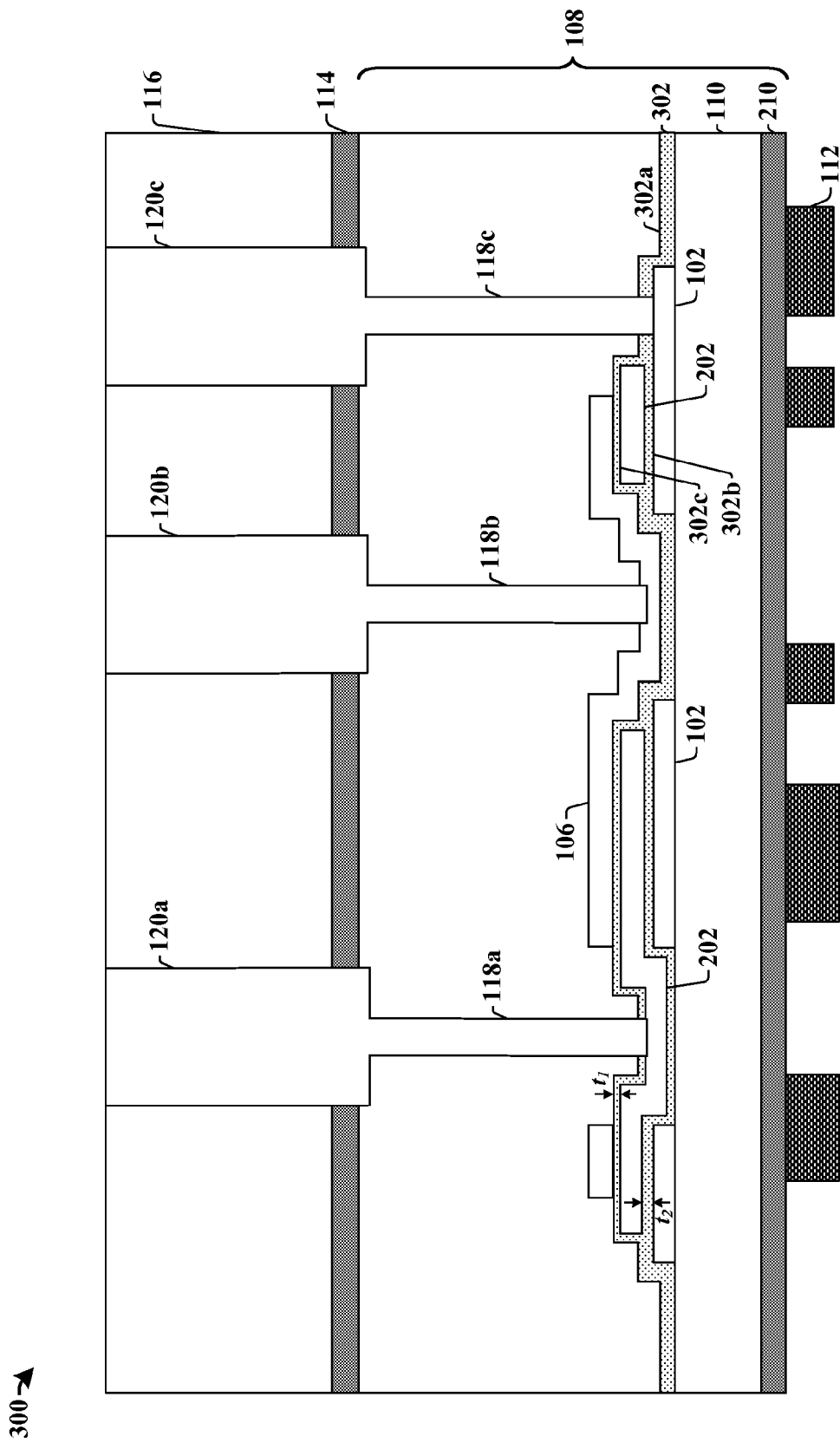
FIG. 3 illustrates a cross-sectional view of some embodiments of an integrated chip 300 having a MIM capacitor with a series connection.

FIG. 3 illustrates a cross-sectional view of some embodiments of an integrated chip 300 having a MIM capacitor 301 with a series connection.

The MIM capacitor 301 comprises a bottom capacitor metal layer 102, a middle capacitor metal layer 202, and a top capacitor metal layer 106. The top capacitor metal layer 106 and the middle capacitor metal layer 202 comprise stepped structures that have a varying vertical position. The stepped structure of the top capacitor metal layer 106 causes it to be both laterally and vertically separated from the middle capacitor metal layer 202 and the bottom capacitor metal layer 102. The varying vertical position allows for a first via 118a, a second via 118b, and a third via 118c, to respectively contact the middle capacitor metal layer 202, the top capacitor metal layer 106 and the bottom capacitor metal layer 102 at a similar vertical position. By contacting the capacitor metal layers at a similar vertical position, fabrication of the vias 118 are simplified, since a similar amount of the capacitor ILD layer 108 is etched to reach the bottom, middle, and top capacitor metal layers (i.e., since the via holes used to form vias 118a-118c are stopped at a substantially same height).

A capacitor dielectric layer 302 is configured to separate the bottom capacitor metal layer 102, the middle capacitor metal layer 202, and the top capacitor metal layer 106. In some embodiments, the capacitor dielectric layer 302 continuously extends between the bottom capacitor metal layer 102, the middle capacitor metal layer 202, and the top capacitor metal layer 106. For example, the capacitor dielectric layer 302 may branch out from a main branch 302a to a lower branch 302b and an upper branch 302c before converging back to the main branch 302a. The middle capacitor metal layer 202 is disposed between the lower branch 302b and the upper branch 302c of the capacitor dielectric layer 302.

In some embodiments, the capacitor dielectric layer 302 may have a thickness that varies a function of position. The different thicknesses of the multi-pronged capacitor dielectric layer 302 allow for MIM capacitor 301 to provide for different capacitive values. For example, a thickness $t_1$ between the middle and top capacitor metal layers, 202 and 106, allows for MIM capacitor 301 to provide for a first capacitance. The larger thickness $t_2$ between the bottom and middle capacitor metal layers, 102 and 202, provides for a second capacitance, smaller than the first capacitance. In some embodiments, the bottom and top capacitor metal layer, 102 and 106, may be provided with a different voltage than the middle capacitor metal layer 202 to form a series connection that provides for yet another capacitance value.

Figure 4:
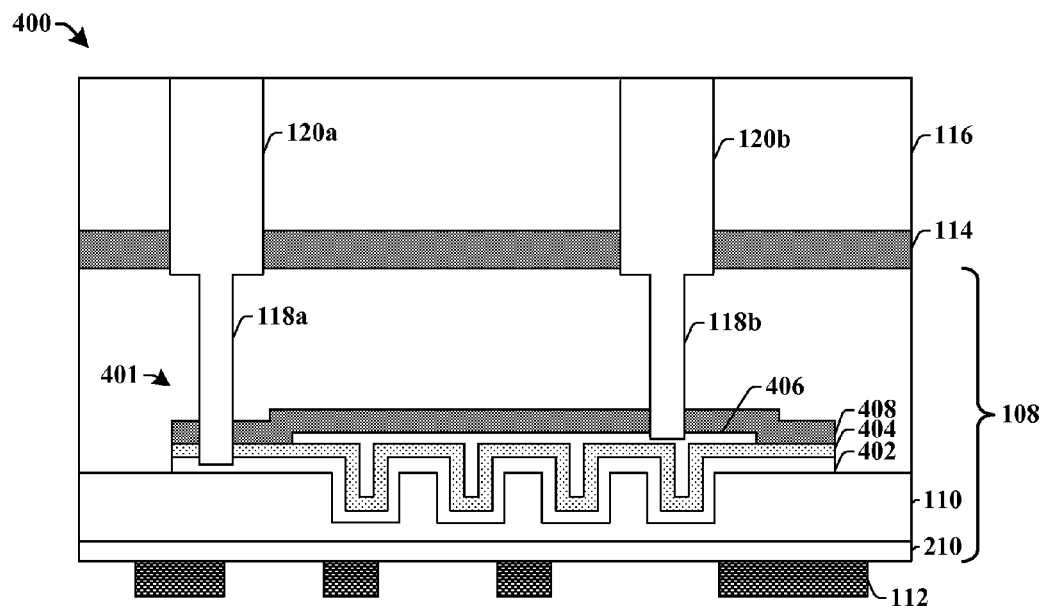
FIG. 4 illustrates a cross-sectional view of some embodiments of an integrated chip having a MIM capacitor with a crown type structure.

FIG. 4 illustrates a cross-sectional view of some embodiments of an integrated chip 400 having a MIM capacitor 401 with a crown type structure.

The MIM capacitor 401 comprises a bottom capacitor metal layer 402 disposed over a dielectric buffer layer 110. The bottom capacitor metal layer 402 comprises a serpentine structure that vertically winds between a first vertical position and an overlying second vertical position. The first vertical position underlies opposite outer edges of the bottom capacitor metal layer 402, so that the first vertical position is within the dielectric buffer layer 110. The second vertical position vertically equal to opposite outer edges of the bottom capacitor metal layer 402, so that the second vertical position overlies the dielectric buffer layer 110.

A capacitor dielectric layer 404 is disposed onto the bottom capacitor metal layer 402. Since the bottom capacitor metal layer 402 comprises a serpentine structure, the capacitor dielectric layer 404 also comprises a serpentine structure. A top capacitor metal layer 406 is disposed onto the capacitor dielectric layer 404. In some embodiments, the top capacitor metal layer 406 may have a bottom surface that protrudes into openings in the capacitor dielectric layer 404, and a substantially flat top surface. A first etch stop layer 408 is disposed onto the top capacitor metal layer 406 and the capacitor dielectric layer 404.

The serpentine structure of the bottom capacitor metal layer 402 increases the surface area between the bottom capacitor metal layer 402 and the top capacitor metal without increasing the area that the MIM capacitor consumes in an integrated chip design. By increasing the surface area between the bottom capacitor metal layer 402 and the top capacitor metal, MIM capacitor 401 is able to provide for a larger capacitance than planar MIM capacitors (e.g., MIM capacitor 301).

Figure 5:
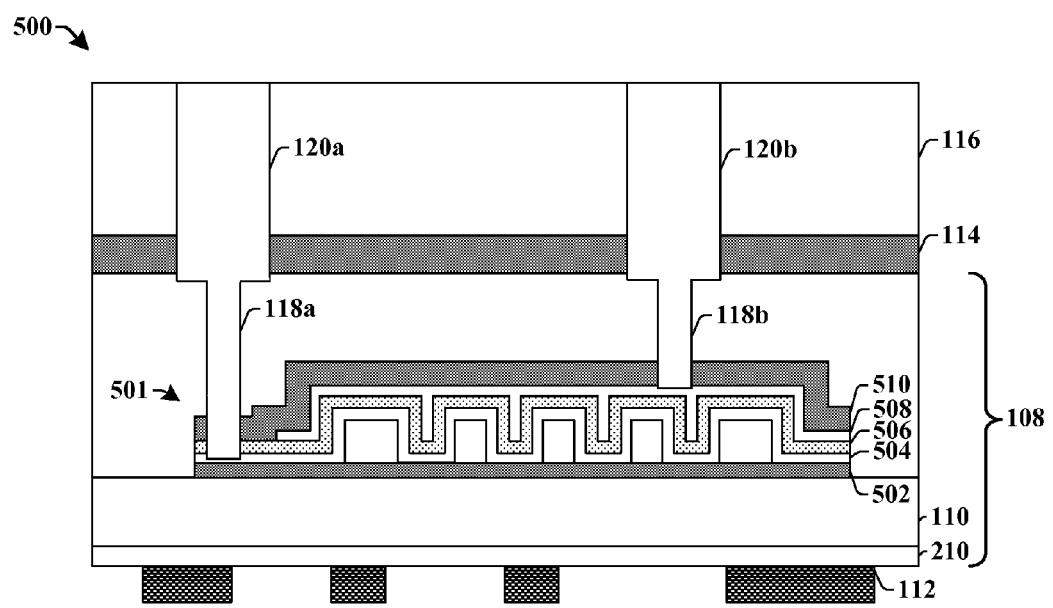
FIG. 5 illustrates a cross-sectional view of some alternative embodiments of an integrated chip having a MIM capacitor with a crown type structure.

FIG. 5 illustrates a cross-sectional view of some alternative embodiments of an integrated chip 500 having a MIM capacitor 501 with a crown type structure.

The MIM capacitor 501 comprises a lower etch stop layer 502 disposed over a dielectric buffer layer 110. A bottom capacitor metal layer 504 is disposed over the lower etch stop layer 502. The bottom capacitor metal layer 504 comprises a serpentine structure that vertically winds between a first vertical position and an overlying second vertical position. The first vertical position is vertically equal to opposite outer edges of the bottom capacitor metal layer 504. The second vertical position overlies opposite outer edges of the bottom capacitor metal layer 504.

A capacitor dielectric layer 506 is disposed onto the bottom capacitor metal layer 504. Since the bottom capacitor metal layer 504 comprises a serpentine structure, the capacitor dielectric layer 506 also comprises a serpentine structure. A top capacitor metal layer 508 is disposed onto the capacitor dielectric layer 506. In some embodiments, the top capacitor metal layer 508 may have a bottom surface that protrudes into openings in the capacitor dielectric layer 506, and a substantially flat top surface. A capacitor etch stop layer 510 is disposed onto the top capacitor metal layer 508 and the capacitor dielectric layer 506.

Figure 6:
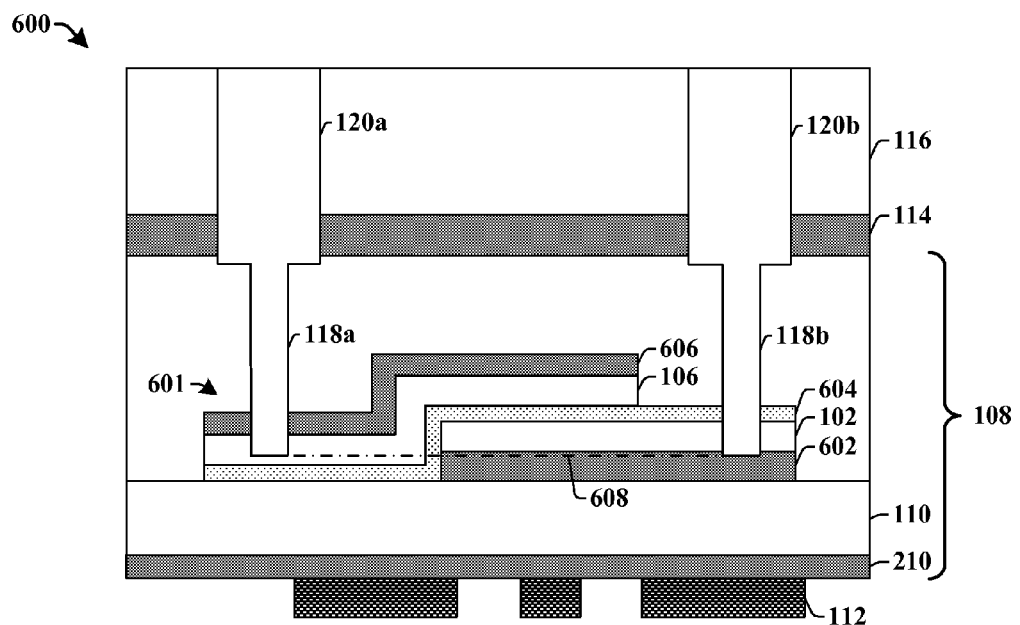
FIG. 6 illustrates a cross-sectional view of some embodiments of an integrated chip having a MIM capacitor with vertically aligned via landing areas.

FIG. 6 illustrates a cross-sectional view of some alternative embodiments of an integrated chip 600 having a MIM capacitor 601 with vertically aligned via landing areas.

MIM capacitor 601 comprises an etch stop layer 602 disposed over a dielectric buffer layer 110, and a bottom capacitor metal layer 102 located on a top surface of the etch stop layer 602. A capacitor dielectric layer 604 extends as a stepped structure from a position overlying the bottom capacitor metal layer 102 to a position on top of the dielectric buffer layer 110. A top capacitor metal layer 106 is disposed onto the capacitor dielectric layer 604, so that the top capacitor metal layer 106 also comprises a stepped structure, which is both laterally disposed from the bottom capacitor metal layer 102 and vertically disposed above the bottom capacitor metal layer 102. A etch stop layer 606 is disposed over the top capacitor metal layer 106.

Typically, the stacked electrode structure of a MIM capacitor has topography differences between capacitor metal layers that make it difficult to form vias (e.g., since more of the capacitor ILD layer 108 is etched to reach the bottom capacitor metal layer 102 than to reach the top capacitor metal layer 106). However, the stepped structure of the top capacitor metal layer 106 provides for a simplification of the fabrication of the plurality of vias 118. This is because the stepped structure allows for via 118a and 118b to extend to a substantially same vertical position along line 608, thereby reducing topographical differences between the top capacitor metal layer 106 and the bottom capacitor metal layer 102 and mitigating etching differences between the vias 118a and 118b.

Figure 7:
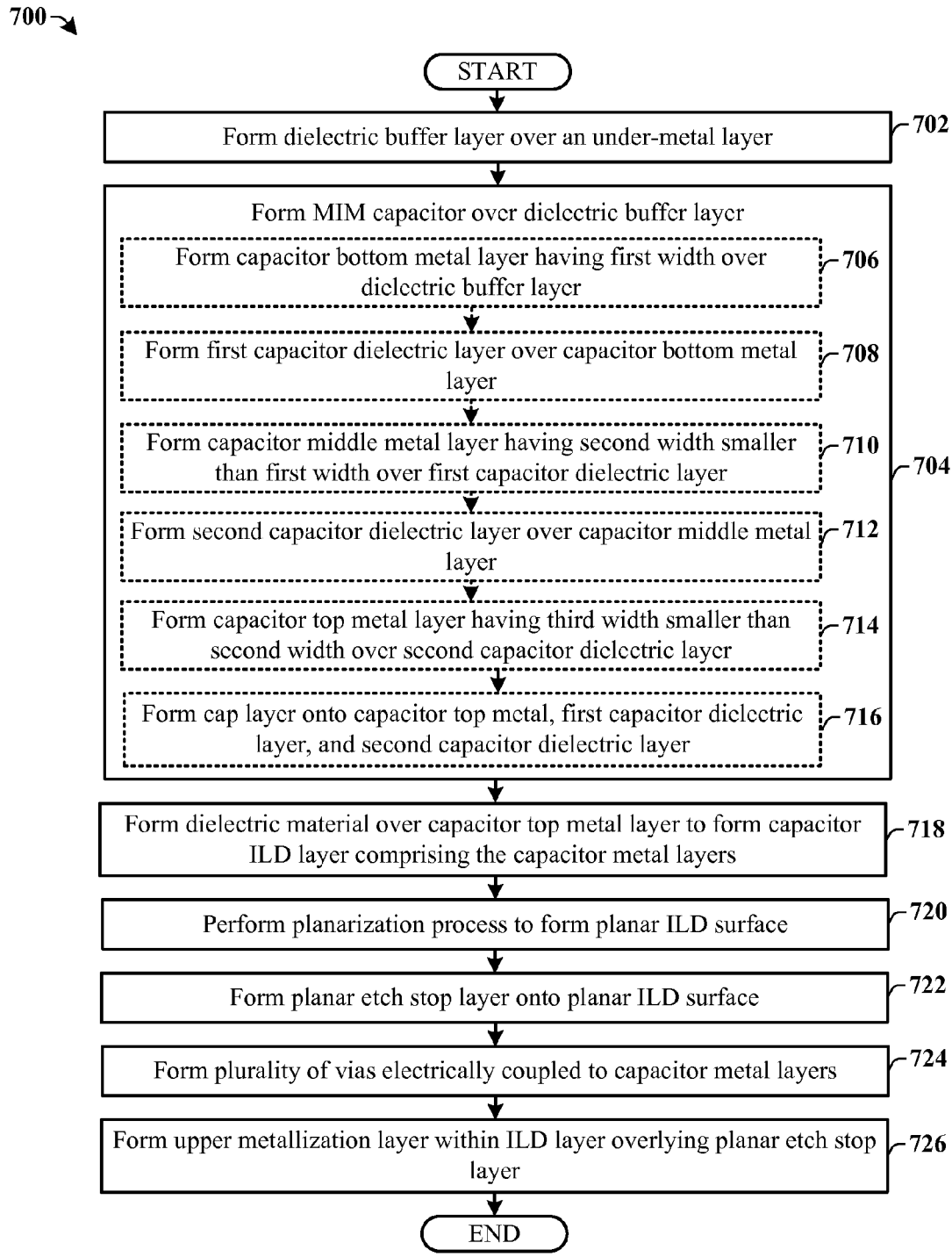
FIG. 7 illustrates a flow diagram of some embodiments of a method of forming an integrated chip comprising a MIM capacitor.

FIG. 7 illustrates a flow diagram of some embodiments of a method 600 of forming an integrated chip comprising a MIM capacitor.

While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, a dielectric buffer layer is formed over an under-metal layer. The under-metal layer comprises a metal interconnect layer within a back-end-of-the-line (BEOL) stack of an integrated chip.

At 704, a MIM (metal-insulator-metal) capacitor is formed over the dielectric buffer layer. In some embodiments, the MIM capacitor may be formed according to acts 606-618.

At 706, a bottom capacitor metal layer is formed over the dielectric buffer layer. The bottom capacitor metal layer may have a first width. In some embodiments, the bottom capacitor metal layer may comprise a serpentine structure that vertically winds between a first height and a second height. In some embodiments, the first height may be within the buffer dielectric layer. In other embodiments, the first height may over the buffer dielectric layer.

At 708, a first capacitor dielectric layer is formed over the bottom capacitor metal layer.

At 710, a middle capacitor metal layer is formed over the capacitor dielectric layer. The middle capacitor metal layer may have a second width less than the first width.

At 712, a second capacitor dielectric layer is formed over the middle capacitor metal layer. In some embodiments, the first and second capacitor dielectric layers may comprise a same dielectric layer that extends continuously between the bottom capacitor metal layer, the middle capacitor metal layer, and a top capacitor metal layer (formed at act 714).

At 714, a top capacitor metal layer is formed over the second capacitor dielectric layer. The top capacitor metal layer may have a third width less than the second width. In some embodiments, the top capacitor metal layer comprises a stepped structure formed at a position that is laterally and vertically separated from the middle capacitor metal layer by the second capacitor dielectric layer.

At 716, a cap layer may be formed over the top capacitor metal layer. In some embodiments, the cap layer may be formed onto the top capacitor metal layer, the first capacitor dielectric layer and the second capacitor dielectric layer.

Although acts 706-716 describe the formation of the bottom capacitor metal layer (act 706), the middle capacitor metal layer (act 710), and the top capacitor metal layer (act 714) in a sequential manner, it will be appreciated that the method is not limited to such a sequential formation. For example, in some embodiments, the MIM capacitor may be formed by depositing a stack comprising a capacitor bottom metal layer, a capacitor middle metal layer, and a capacitor top metal layer separated by one or more capacitor dielectric layers. The capacitor top metal layer is then patterned to define a third width of the capacitor top metal layer. The capacitor middle metal layer is then patterned to define a second width of the capacitor middle metal layer. A cap layer and a capacitor etch stop layer are then deposited, and the capacitor bottom metal layer, the cap layer, and the capacitor etch stop layer are patterned to define a first width of the capacitor bottom metal layer.

At 718, a capacitor inter-level dielectric (ILD) layer comprising an insulating dielectric material is formed over the MIM capacitor.

At 720, a planarization process is performed to remove a portion of the capacitor ILD layer and to form a planar capacitor ILD surface overlying the MIM capacitor.

At 722, a planar etch stop layer is formed over the capacitor ILD layer. In some embodiments, the planar etch stop layer is formed by performing a planarization process on the ILD layer to form a substantially planar surface. The planar etch stop layer is then deposited onto the substantially planar surface to form the planar etch stop layer.

At 724, a plurality of vias may be formed to provide for electrical connections to the metal layers of the MIM capacitor. The plurality of vias may be formed performing a selective etching process to form via holes vertically extending through the planar etch stop layer, the capacitor ILD layer, the MIM capacitor (e.g., the top capacitor metal layer, the bottom capacitor metal layer, etc.), and the buffer dielectric layer. A metal (e.g., copper, tungsten, aluminum, etc.) is then deposited within the openings to form the plurality of vias.

In some embodiments, a first via hole is formed to vertically extend through the capacitor ILD layer to a first position that electrically contacts the bottom capacitor metal layer, a second via hole is formed to vertically extend through the capacitor ILD layer to a second position that electrically contacts the middle capacitor metal layer, and a third via hole is formed to vertically extend through the capacitor ILD layer to a third position that electrically contacts the top capacitor metal layer. In some embodiments, the first via hole, the second via hole, and the third via hole extend to a substantially same vertical position.

At 726, an upper metallization layer is formed within a metal inter-level dielectric (ILD) layer overlying the planar etch stop layer. In some embodiments, the upper metallization layer may comprise a metal wire layer comprising a conductive material configured to provide a lateral connection. In some embodiments, the upper metallization layer may be formed by performing a selective etching process to form trenches within the metal ILD layer and then depositing a metal (e.g., copper, aluminum, etc.) within the trenches in the metal ILD layer.

Therefore, the present disclosure relates to a MIM (metal-insulator-metal) capacitor, and an associated method of formation.

In some embodiments, the present disclosure relates to a MIM (metal-insulator-metal) capacitor. The MIM capacitor comprises a first electrode having a bottom capacitor metal layer and a capacitor dielectric layer disposed onto and in direct contact with the bottom capacitor metal layer. The MIM capacitor further comprises a second electrode comprising a top capacitor metal layer disposed onto and in direct contact with the capacitor dielectric layer. The MIM capacitor further comprises a capacitor inter-level dielectric (ILD) layer disposed over the top capacitor metal layer, and a substantially planar etch stop layer disposed over the capacitor ILD layer.

In other embodiments, the present disclosure relates to a MIM (metal-insulator-metal) capacitor. The MIM capacitor comprises a first electrode having a bottom capacitor metal layer disposed onto and in direct contact with a dielectric buffer layer disposed over an under-metal layer disposed comprising one or more metal structures located under the bottom capacitor metal layer. The MIM capacitor further comprises a second electrode having a middle capacitor metal layer separated from the bottom capacitor metal layer by a first capacitor dielectric layer disposed onto and in direct contact with the bottom capacitor metal layer. The MIM capacitor further comprises a third electrode having a top capacitor metal layer separated from the middle capacitor metal layer by a second capacitor dielectric layer disposed onto and in direct contact with the middle capacitor metal layer. The MIM capacitor further comprises a capacitor inter-level dielectric (ILD) layer disposed over the top capacitor metal layer, and a substantially planar etch stop layer disposed over the capacitor ILD layer.

In yet other embodiments, the present disclosure relates to a method of forming a MIM (metal-insulator-metal) capacitor. The method comprises forming a bottom capacitor metal layer at a position that is in direct contact with a dielectric buffer layer disposed over an under-metal layer disposed comprising one or more metal structures located under the bottom capacitor metal layer. The method further comprises forming a capacitor dielectric layer onto and the bottom capacitor metal layer, and forming a top capacitor metal layer over the capacitor dielectric layer. The method further comprises forming a capacitor inter-level dielectric (ILD) layer over the top capacitor metal layer. The method further comprises performing a planarization process on the capacitor ILD layer to form a substantially planar ILD surface, and forming a substantially planar etch stop layer disposed over the inter-metal dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A MIM (metal-insulator-metal) capacitor, comprising:
   a first electrode comprising a bottom capacitor metal layer;
   a capacitor dielectric layer disposed onto and in direct contact with the bottom capacitor metal layer;
   a second electrode comprising a top capacitor metal layer disposed onto and in direct contact with the capacitor dielectric layer;
   a third electrode comprising a middle capacitor metal layer, separated from the top capacitor metal layer by a second capacitor dielectric layer;
   a capacitor inter-level dielectric (ILD) layer disposed over the top capacitor metal layer;
   a substantially planar etch stop layer disposed over the capacitor ILD layer;
   a plurality of vias extending through the capacitor ILD layer to the first electrode and the second electrode; and
   a plurality of metal wires overlying the plurality of vias, wherein the plurality of metal wires extend through the etch stop layer and have a greater width than the plurality of vias at an interface between the plurality of metal wires and the plurality of vias.

2. The MIM capacitor of claim 1, wherein the middle capacitor metal layer extends beyond the top capacitor metal layer on opposing sides.

3. The MIM capacitor of claim 1, wherein the plurality of vias comprise:
   a first via vertically extending through the capacitor dielectric layer to a first position that electrically contacts the bottom capacitor metal layer;
   a second via vertically extending through the second capacitor dielectric layer to a second position that electrically contacts the middle capacitor metal layer; and
   a third via vertically extending through the capacitor ILD layer to a third position that electrically contacts the top capacitor metal layer.

4. The MIM capacitor of claim 1, wherein the bottom capacitor metal layer, the middle capacitor metal layer, and the top capacitor metal layer have a thickness that is between approximately 100 angstrom and approximately 800 angstrom.

5. The MIM capacitor of claim 1, wherein the capacitor dielectric layer comprises one or more of the following: silicon dioxide ($SiO_2$), silicon nitride ($Si_3N_4$), aluminum oxide ($Al_2O_3$), tantalum oxide ($Ta_2O_5$), titanium oxide ($TiO_2$), strontium titanate ($SrTiO_3$), zirconium oxide ($ZrO_2$), hafnium oxide ($HfO_2$), hafnium silicate ($HfSiO_4$), lanthanum oxide ($La_2O_3$), or yttrium oxide ($Y_2O_3$).

6. The MIM capacitor of claim 1, wherein the bottom capacitor metal layer is disposed onto and in direct contact with a dielectric buffer layer located over an under-metal layer comprising one or more metal structures located under the bottom capacitor metal layer.

7. The MIM capacitor of claim 1, wherein the third electrode is separated from a first via contacting the first electrode and is further separated from a second via contacting the second electrode, and wherein the first via and the second via are different vias.

8. The MIM capacitor of claim 1, wherein the third electrode is not in contact with an underlying or an overlying via.

9. The MIM capacitor of claim 1, further comprising: a dielectric buffer layer located over an under-metal layer comprising one or more metal structures located under the bottom capacitor metal layer, wherein the capacitor dielectric layer continuously extends from a location in contact with the dielectric buffer layer to locations vertically between the first electrode and second electrode and vertically between the second electrode and the third electrode.

10. The MIM capacitor of claim 1, wherein the capacitor dielectric layer and the third electrode are laterally located between segments of the first electrode.

11. The MIM capacitor of claim 1, wherein the capacitor dielectric layer is laterally arranged between parts of the first electrode.

12. The MIM capacitor of claim 3, wherein the first via, the second via, and the third via, respectively contact the bottom capacitor metal layer, the middle capacitor metal layer and the top capacitor metal layer at a substantially same vertical position.

13. The MIM capacitor of claim 6, wherein the bottom capacitor metal layer extends beyond the top capacitor metal layer on opposing sides to form a stepped pyramid structure having steps that recede in size as a distance from the dielectric buffer layer increases.

14. A MIM (metal-insulator-metal) capacitor, comprising:
a first electrode comprising a bottom capacitor metal layer disposed onto and in direct contact with a dielectric buffer layer disposed over an under-metal layer comprising one or more metal structures located under the bottom capacitor metal layer;
a second electrode comprising a middle capacitor metal layer separated from the bottom capacitor metal layer by a first capacitor dielectric layer disposed onto and in direct contact with the bottom capacitor metal layer;
a third electrode comprising a top capacitor metal layer separated from the middle capacitor metal layer by a second capacitor dielectric layer disposed onto and in direct contact with the middle capacitor metal layer;
a capacitor inter-level dielectric (ILD) layer disposed over the top capacitor metal layer;
a substantially planar etch stop layer disposed over the capacitor ILD layer; and
wherein the bottom capacitor metal layer extends beyond the middle capacitor metal layer on opposing sides and the middle capacitor metal layer extends beyond the top capacitor metal layer on opposing sides, so as to form a stepped pyramid structure having steps that recede in size as a distance from the dielectric buffer layer increases.

15. The MIM capacitor of claim 14, further comprising:
a first via vertically extending through the first capacitor dielectric layer to a first position that electrically contacts the bottom capacitor metal layer;
a second via vertically extending through the second capacitor dielectric layer to a second position that electrically contacts the middle capacitor metal layer; and
a third via vertically extending through the capacitor ILD layer to a third position that electrically contacts the top capacitor metal layer.

16. The MIM capacitor of claim 15, wherein the first via, the second via, and the third via, respectively contact the bottom capacitor metal layer, the middle capacitor metal layer and the top capacitor metal layer at a substantially same vertical position.

17. A method of forming an integrated chip having a MIM (metal-insulator-metal) capacitor, comprising:
forming a bottom capacitor metal layer at a position that is in direct contact with a dielectric buffer layer disposed over an under-metal layer comprising one or more metal structures located under the bottom capacitor metal layer;
forming a capacitor dielectric layer onto and in contact with the bottom capacitor metal layer;
forming a top capacitor metal layer over the capacitor dielectric layer;
forming a capacitor inter-level dielectric (ILD) layer over the top capacitor metal layer;
performing a planarization process on the capacitor ILD layer to form a substantially planar ILD surface;
forming a substantially planar etch stop layer disposed over the capacitor ILD layer; and
forming a first via hole that vertically extends through the capacitor ILD layer to a first position that electrically contacts the bottom capacitor metal layer and a second via hole that vertically extends through the capacitor ILD layer to a second position that electrically contacts the top capacitor metal layer, wherein the first via hole and the second via hole extend to a same vertical position.

18. The method of claim 17, further comprising:
forming a middle capacitor metal layer over the capacitor dielectric layer;
forming a second capacitor dielectric layer onto and in contact with the middle capacitor metal layer; and
wherein the second capacitor dielectric layer is also in direct contact with top capacitor metal layer.

19. The method of claim 18, further comprising:
forming a third via hole that vertically extending through the capacitor ILD layer to a third position that electrically contacts the middle capacitor metal layer; and
wherein the first via hole, the second via hole, and the third via hole extend to the substantially same vertical position.

* * * * *